(12) United States Patent
Palaskas et al.

(10) Patent No.: US 10,886,878 B2
(45) Date of Patent: Jan. 5, 2021

(54) MODULATION CIRCUITRY WITH N.5 DIVISION

(71) Applicant: Intel IP Corporation, Santa Clara, CA (US)

(72) Inventors: Georgios Yorgos Palaskas, Portland, OR (US); Paolo Madoglio, Beaverton, OR (US); Dirk Friedrich, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/321,308

(22) PCT Filed: Sep. 26, 2016

(86) PCT No.: PCT/US2016/054367
§ 371 (c)(1),
(2) Date: Jan. 28, 2019

(87) PCT Pub. No.: WO2018/063223
PCT Pub. Date: Apr. 5, 2018

(65) Prior Publication Data
US 2019/0214944 A1    Jul. 11, 2019

(51) Int. Cl.
| | | |
|---|---|---|
| H03B 19/12 | (2006.01) | |
| H03C 5/00 | (2006.01) | |
| H03M 1/86 | (2006.01) | |
| H04B 1/04 | (2006.01) | |
| H03C 3/09 | (2006.01) | |

(52) U.S. Cl.
CPC .......... *H03B 19/12* (2013.01); *H03C 3/0908* (2013.01); *H03C 3/0916* (2013.01); *H03C 5/00* (2013.01); *H03M 1/86* (2013.01); *H04B 1/0475* (2013.01)

(58) Field of Classification Search
CPC .... H03B 19/12; H03C 3/0908; H03C 3/0916; H03C 5/00; H04B 1/0475; H03M 1/86
USPC .......................................................... 331/51
See application file for complete search history.

(56) References Cited

U.S. PATENT DOCUMENTS

| | | | |
|---|---|---|---|
| 5,442,670 A * | 8/1995 | Shu ........................ | H03K 21/10 327/113 |
| 8,558,575 B1 * | 10/2013 | Abernethy ............. | H03K 21/10 326/52 |
| 2003/0198311 A1 | 10/2003 | Song et al. | |
| 2015/0049840 A1 | 2/2015 | Banin et al. | |

OTHER PUBLICATIONS

International Search Report and Written Opinion dated Jun. 9, 2017 for PCT Application PCT/US2016/054367.

* cited by examiner

*Primary Examiner* — Richard Tan
(74) *Attorney, Agent, or Firm* — 2SPL Patent Attorneys PartG mbB

(57) ABSTRACT

Modulation circuitry is configured to generate a phase modulated signal having an output frequency that corresponds to a local oscillator (LO) signal divided by N.5. A phase locked loop (PLL) is configured to generate an LO signal having a frequency that is N.5 times the output frequency. Pulse circuitry configured to generate, based at least on a value of N, an edge signal including a pulse aligned with a positive edge of the LO signal and a pulse aligned with a negative edge of the LO signal. The edge signal is used to generate the phase modulated signal.

25 Claims, 10 Drawing Sheets

| CLOCK | L11 | L12 | L21 | L22 | L31 | L32 | L41 | L42 | L51 | L52 | AND |
|---|---|---|---|---|---|---|---|---|---|---|---|
| Rise | 1 | 1 | 1 | 1 | 0 | 0 | 1 | 1 | 0 | 0 | F |
| Fall | 0 | 1 | 1 | 1 | 1 | 0 | 0 | 1 | 1 | 0 | T |
| Rise | 0 | 0 | 1 | 1 | 1 | 1 | 0 | 0 | 1 | 1 | T |
| Fall | 1 | 0 | 0 | 1 | 1 | 1 | 1 | 0 | 0 | 1 | F |
| Rise | 1 | 1 | 0 | 0 | 1 | 1 | 1 | 1 | 0 | 0 | F |
| Fall | 0 | 1 | 1 | 0 | 0 | 1 | 1 | 1 | 1 | 0 | F |
| Rise | 0 | 0 | 1 | 1 | 0 | 0 | 1 | 1 | 1 | 1 | T |
| Fall | 1 | 0 | 0 | 1 | 1 | 0 | 0 | 1 | 1 | 1 | T |
| Rise | 1 | 1 | 0 | 0 | 1 | 1 | 0 | 0 | 1 | 1 | F |
| Fall | 1 | 1 | 1 | 0 | 0 | 1 | 1 | 0 | 0 | 1 | F |
| Rise | 1 | 1 | 0 | 1 | 0 | 0 | 1 | 1 | 0 | 0 | F |
| fall | 0 | 1 | 1 | 1 | 0 | 0 | 0 | 1 | 1 | 0 | T |

Duty Cycle 3:2

FIG. 10D

| CLOCK | L11 | L12 | L21 | L22 | L31 | L32 | L41 | L42 | L51 | L52 | L61 | L62 | L71 | L72 | OR |
|---|---|---|---|---|---|---|---|---|---|---|---|---|---|---|---|
| Rise | 1 | 1 | 0 | 0 | 0 | 0 | 0 | 0 | 1 | 1 | 0 | 0 | 0 | 0 | F |
| Fall | 0 | 1 | 1 | 0 | 0 | 0 | 0 | 0 | 0 | 1 | 1 | 0 | 0 | 0 | F |
| Rise | 0 | 0 | 1 | 1 | 0 | 0 | 0 | 0 | 0 | 0 | 1 | 1 | 0 | 0 | F |
| Fall | 0 | 0 | 0 | 1 | 1 | 0 | 0 | 0 | 0 | 0 | 0 | 1 | 1 | 0 | F |
| Rise | 0 | 0 | 0 | 0 | 1 | 1 | 0 | 0 | 0 | 0 | 0 | 0 | 1 | 1 | T |
| Fall | 1 | 0 | 0 | 0 | 0 | 1 | 1 | 0 | 0 | 0 | 0 | 0 | 0 | 1 | T |
| Rise | 1 | 1 | 0 | 0 | 0 | 0 | 1 | 1 | 0 | 0 | 0 | 0 | 0 | 0 | T |
| Fall | 0 | 1 | 1 | 0 | 0 | 0 | 0 | 1 | 1 | 0 | 0 | 0 | 0 | 0 | F |
| Rise | 0 | 0 | 1 | 1 | 0 | 0 | 0 | 0 | 1 | 1 | 0 | 0 | 0 | 0 | F |
| Fall | 0 | 0 | 0 | 1 | 1 | 0 | 0 | 0 | 0 | 1 | 1 | 0 | 0 | 0 | F |
| Rise | 0 | 0 | 0 | 0 | 1 | 1 | 0 | 0 | 0 | 0 | 1 | 1 | 0 | 0 | F |
| Fall | O | 0 | 0 | 0 | 0 | 1 | 1 | 0 | 0 | 0 | 0 | 1 | 1 | 0 | T |
| Rise | 0 | O | 0 | 0 | 0 | 0 | 1 | 1 | 0 | 0 | 0 | 0 | 1 | 1 | T |
| Fall | 1 | 0 | O | 0 | 0 | 0 | 0 | 1 | 1 | 0 | 0 | 0 | 0 | 1 | T |

3.5 Divider

FIG. 11

MODULATION CIRCUITRY WITH N.5 DIVISION

This application is a National Phase entry application of International Patent Application No. PCT/US2016/054367 filed Sep. 29, 2016, entitled "MODULATION CIRCUITRY WITH N.5 DIVISION" in the name of Georgios Yorgos Palaskas et al. and is hereby incorporated by reference in its entirety.

FIELD

The present disclosure relates to the field of radio frequency (RF) transceivers and in particular to methods and apparatus for manipulating the output frequency of a phase locked loop system.

BACKGROUND

The polar transmitter is a popular transmitter architecture for cellular transceivers due to the polar transmitter's higher power efficiency as compared to a Cartesian or IQ transmitter. A polar transmitter includes two parallel paths: a phase path that generates a phase modulated signal and an amplitude path that generates an amplitude modulation signal. The phase path includes modulator circuitry that processes a frequency or phase component of a polar data sample to generate a phase modulated RF signal. The amplitude path includes circuitry that processes a magnitude component of the polar data sample to generate an amplitude modulation signal. In a polar transmitter, a radio frequency digital to analog converter (RFDAC), power amplifier (PA), or mixer combines the phase modulated RF signal with the amplitude modulation signal to produce an RF signal that encodes the data sample.

BRIEF DESCRIPTION OF THE DRAWINGS

Some examples of circuits, apparatuses and/or methods will be described in the following by way of example only. In this context, reference will be made to the accompanying Figures.

FIG. 6 illustrates another example embodiment of a digital to time converter (DTC) of the modulation circuitry of FIG. 2.

FIG. 10A illustrates one embodiment of the modulation circuitry of FIG. 2.

FIGS. 10B, 10C, and 10D illustrate a tables showing initialization values for the modulation circuitry of FIG. 10A for three different duty cycles.

FIG. 11 illustrates a table showing initialization values for a divide by 3.5 modulation circuitry.

DETAILED DESCRIPTION

Conventional polar transmitters include a DTC that modulates an LO carrier signal with the phase information of a signal being transmitted and a power amplifier (PA) that modulates the amplitude on the phase modulated LO signal to generate the transmit signal. Many of the challenges for polar transmitter architectures arise from wideband signals utilized in many current communication protocols such as WiFi 802.11ac, which have signal bandwidths ranging from 20 MHz to 160 MHz and 3 GPP LTE which has signal bandwidths of up to 40 MHz. These wide bandwidths may require the DTC to operate at high speed or data rate and have dynamic range with a 14 bit resolution. Some conventional techniques, which use a large N-way multiplexer (MUX) and digitally controlled delay lines are cumbersome, slow, noisy, and/or add non-linearities, resulting in poor performance and increased power consumption.

Figure 1:
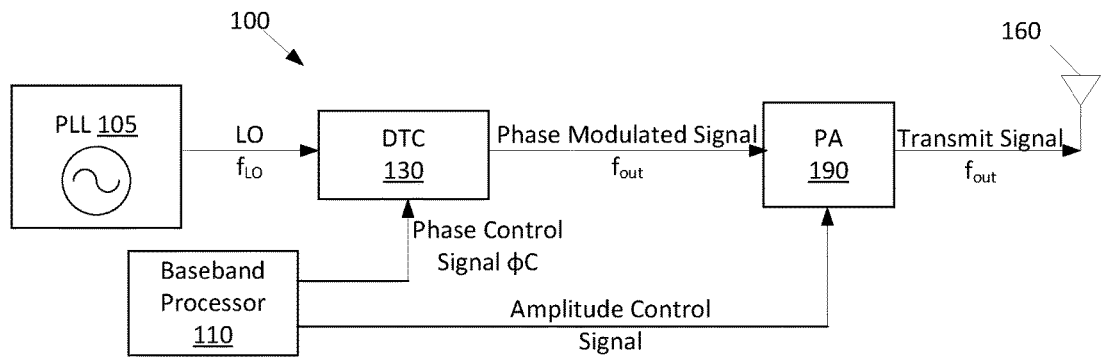
FIG. 1 illustrates a polar transmitter.

FIG. 1 is a block diagram of a polar transmitter 100. The polar transmitter 100 includes a DTC 130 that is configured to receive a phase control signal φC from a baseband processor 110. The DTC provides a phase modulated signal for use in generating a transmit signal for wireless transmission by an antenna 160. As illustrated in FIG. 1, a power amplifier (PA) 190 may be arranged to generate the transmit signal based on the phase information of the phase modulated signal and an amplitude control signal from the baseband processor 110.

Imperfections in the DTC, such as integral non-linearity and dynamic errors, give rise to spurs in the output spectrum. These spurs can be eliminated by feeding the DTC with an LO signal that is N times the average frequency of the transmit signal (hereinafter "output frequency" or $f_{out}$), where N is an integer, to avoid the problematic frequency shift inside the DTC that generates the spurs. To compensate for the fact that the LO signal has a frequency that is a multiple of $f_{out}$, the DTC performs a "divide by N" operation on the LO signal. However, operating the PLL 105 at an integer multiple of the output frequency increases the risk of the PLL's oscillator pulling and/or remodulation due to the power amplifier 190. For example, if N=3, the PLL's oscillator would be operating at the $3^{rd}$ harmonic of the power amplifier 190. For a WiFi system, even an even division by 4 can be problematic for remodulation due to the power amplifier. The transmitters and methods described herein provide a DTC with has an average division factor of N.5 (Integer N+0.5). This eliminates spurs, as does a DTC that has an average division factor of N, but at the same time reduces PLL oscillator pulling since the oscillator operates at N.5 times the output frequency, where there is minimum frequency content.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be incorporated with each other, unless specifically noted otherwise.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 2:
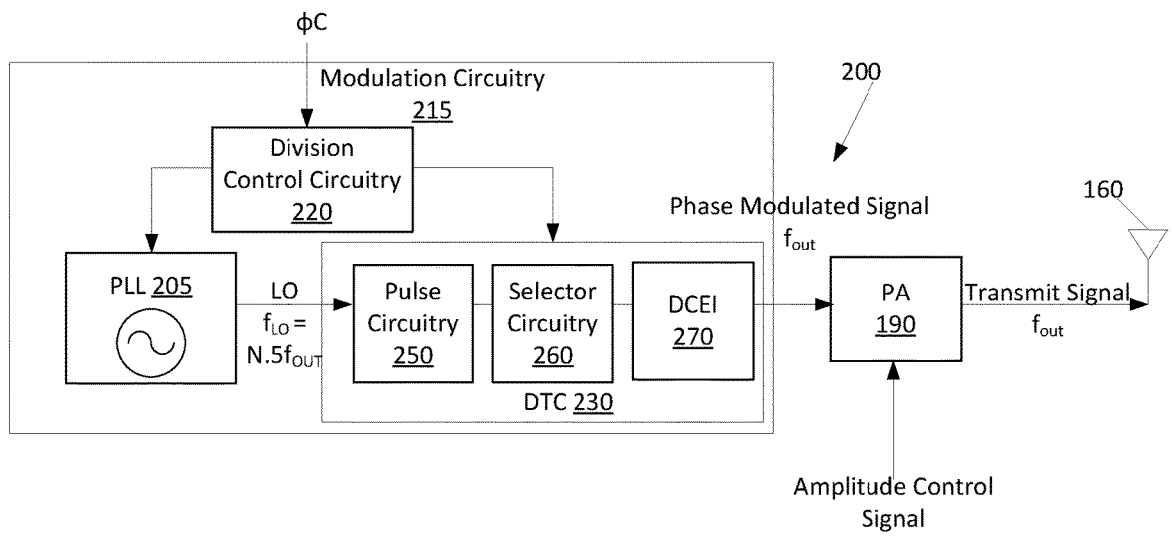
FIG. 2 illustrates one embodiment of a polar transmitter that includes modulation circuitry configured to perform N.5 division on a local oscillator (LO) signal.

FIG. 2 illustrates one embodiment of a polar transmitter 200 that includes modulation circuitry 215 that enables use of an LO signal with a frequency of $N.5f_{out}$ to reduce spurs and pulling. The modulation circuitry 215 includes division control circuitry 220 that inputs the phase control signal $\phi C$. The modulation circuitry 215 includes a PLL 205 with an oscillator that generates the LO signal and a DTC 230 configured to phase modulate the LO signal based on the phase control signal $\phi C$. The DTC 230 includes pulse circuitry 250 with a counter, selector circuitry 260 that uses pulses output by the counter, and a digitally controlled edge interpolator (DCEI) that generates the phase modulated signal. Division control circuitry 220 generates control signals for the PLL 205 and also controls the DTC 230 to perform a divide by N.5 or N.5+/−1 operation based on the phase control signal $\phi C$. When division by N.5 is desired, the division control circuitry 220 generates a PLL control signal that sets the PLL to generate an LO signal having a frequency of $N.5f_{out}$. It can be said that the division control circuitry 220 controls the DTC 230 to perform coarse modulation by counting N.5 or N.5+/−1 periods of the LO signal. While the embodiments herein are described in the context of polar transmitters, it is to be understood that all of the modulation circuitry and modulation techniques described herein may be utilized for polar receivers or transceivers as well. In a polar receiver the modulation circuitry 215 drives a receiver mixer instead of PA 190.

In the embodiment illustrated in FIG. 2, the phase modulation is being performed by the DTC 230. Thus, the PLL 205 is outputting an unmodulated LO signal having frequency $N.5f_{out}$ and the DTC is performing a variable division by N.5+/−1 (e.g., N.5−1, N.5, and N.5+1) to accomplish phase modulation. In other embodiments, the PLL performs the phase modulation and the DTC (or a divider, see FIG. 9) performs a fixed N.5 division on the phase modulated signal output by the PLL. Any embodiments described herein in which the DTC or divider are capable of variable division by N.5+/−1 may be operated in a mode in which the DTC or divider performs a fixed divide by N.5 operation on a phase modulated signal output by the PLL.

Figure 3:
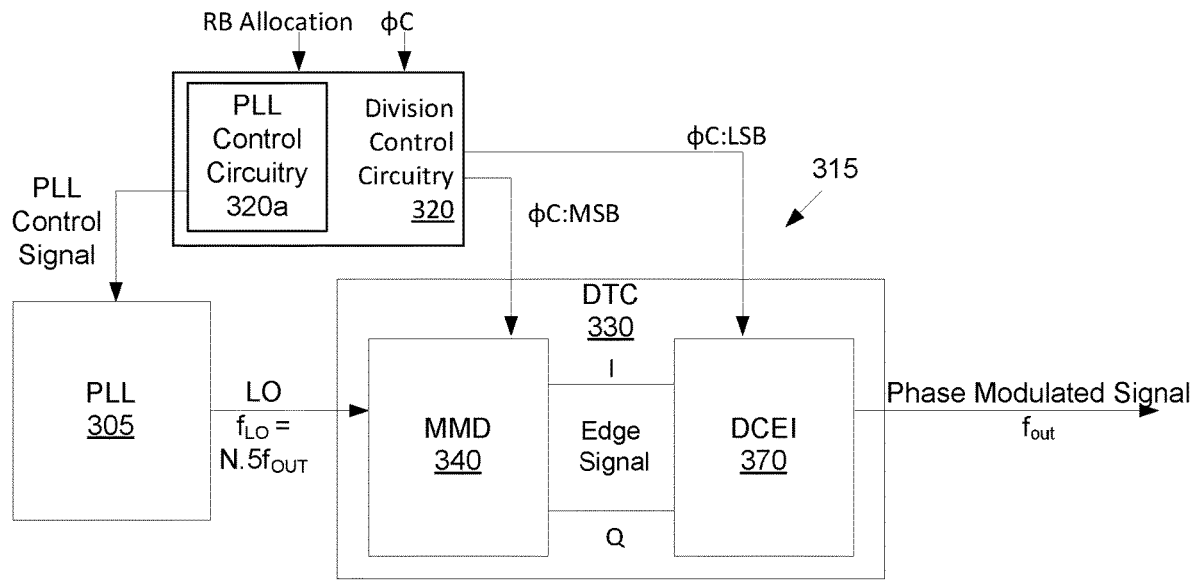
FIG. 3 illustrates one embodiment of the modulation circuitry of FIG. 2.

FIG. 3 illustrates one embodiment of modulation circuitry 315 configured to perform a divide by N.5+/−1 operation and generate, based at least on the phase control signal $\phi C$, a phase modulated signal having an output frequency $f_{out}$. The modulation circuitry includes a PLL 305, division control circuitry 320, and a DTC 330. In one embodiment, the output frequency $f_{out}$ is determined based on a resource block (RB) allocation for the transmit signal. In one embodiment, the division control circuitry 320 determines $f_{out}$ to be a center of the frequency channel when all RBs are allocated to the transmitter or a middle frequency of the combined RBs allocated to the transmitter.

The PLL 305 is configured to generate a fixed or unmodulated LO signal having a frequency that is controlled by the PLL control signal generated by the PLL control circuitry 320a. The PLL control circuitry 320a generates a PLL control signal that causes the PLL to output an LO signal having a frequency of $N.5f_{out}$. The DTC 330 performs phase modulation while dividing by an average of N.5+/−1. The DTC includes a multi-modulus divider (MMD) 340 and a digitally controlled edge interpolator (DCEI) 370. The division control circuitry 320 controls the MMD 340, based on most significant bits (MSBs) of the phase control signal $\phi C$ to perform coarse modulation by counting 2.5, 3.5, 4.5, and so on periods of the LO signal as will be described in more detail below. The outputs of the MMD 340 are edge signals I and Q.

Figure 4:
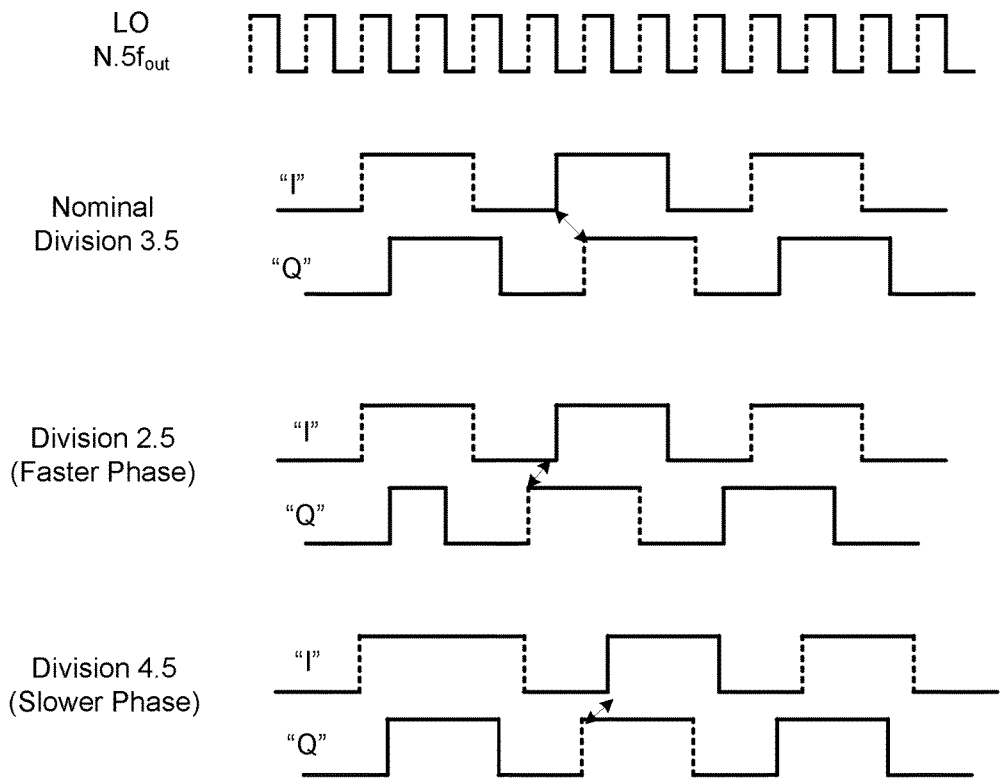
FIG. 4 depicts a timing diagram that illustrates division of an LO signal by N.5+/−1.

FIG. 4 is a timing diagram that illustrates the divide by N.5+/−1 operation performed by the MMD 340. When a nominal division factor of 3.5 is in use, the I and Q edge signals are 3.5 times slower than the LO signal. Note that the first rising and falling edge (e.g., pulse) of the I edge signal are aligned with rising edges of the LO signal (dashed lines), and then the second pulse is aligned with falling edges of the LO signal (solid lines). The inverse is true for the Q edge signal. To "speed up" the output phase in response to LTE/WiFi modulation, one of the edges in the Q signal is accelerated by one LO signal period as shown in FIG. 4 while the LO frequency remains at $3.5f_{out}$. Note that the edges of the modified Q edge signal are still aligned with the falling-falling rising-rising falling-falling and so on edges of the LO signal, just as with the divide by 3.5 operation. To divide by 4.5, one of the edges in the Q signal is delayed by one LO period as shown in FIG. 4 while the LO frequency remains at $3.5f_{out}$.

Referring back to FIG. 3, the division control circuitry 320 controls the DCEI 370 to interpolate between edges in the I and Q edge signal at a location determined by the phase control signal $\phi C$. The signal formed by the interpolated edges output by the DCEI 370 is the phase modulated signal, which will have a frequency of $f_{out}$. The division control circuitry 320 controls the location of the interpolated edge output by the DCEI 370 based on least significant bits (LSBs) in the phase control signal $\phi C$. An example pair of edges being interpolated by the DCEI 370 is indicated by the arrows between edges in each trace in FIG. 4.

Figure 5:
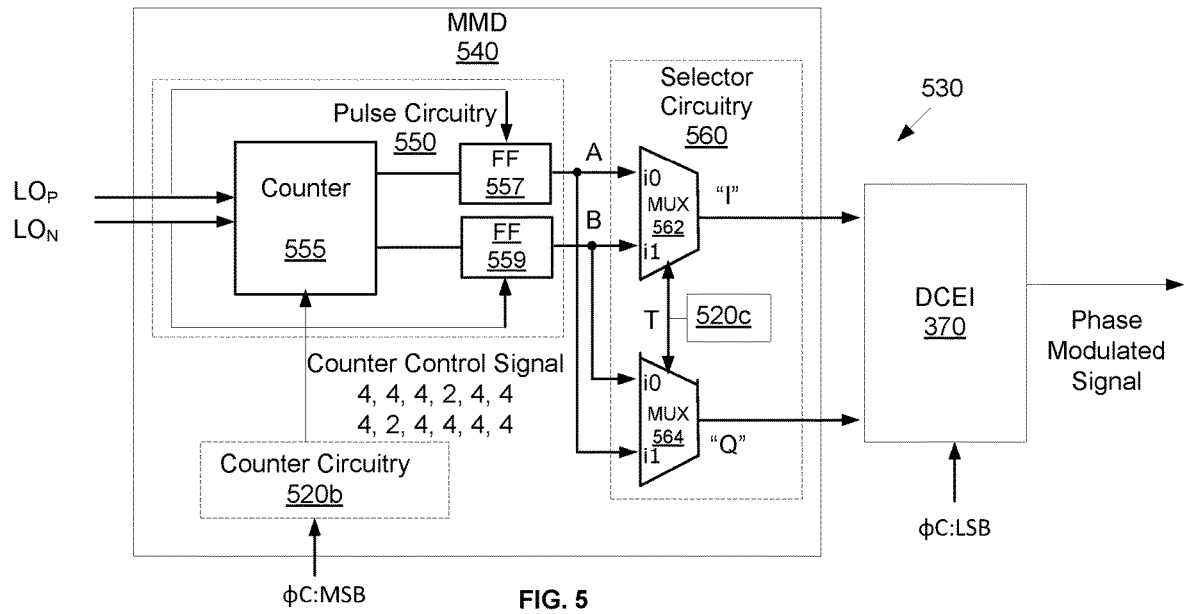
FIG. 5 illustrates one example embodiment of a digital to time converter (DTC) of the modulation circuitry of FIG. 2.

FIG. 5 illustrates one embodiment of a DTC 530 that includes an MMD 540 that performs a divide by N.5+/−1 operation on an LO signal. The MMD 540 includes pulse circuitry 550 configured to generate a first series of pulses (signal A) having edges aligned with positive edges of the LO signal ($LO_P$) and a second series of pulses (signal B) having edges aligned with negative edges ($LO_N$) of the LO signal. The pulse circuitry 550 includes a counter 555 and flip flops 557, 559. Division control circuitry includes counter circuitry 520b configured to control the counter 555 to generate a first signal and a second signal that each include pulses having a selected width. In one embodiment, the counter control signal is generated based at least on the MSBs of the phase control signal φC. The widths of the pulses output by the counter 550 are controlled by the counter control signal.

Figure 5A:
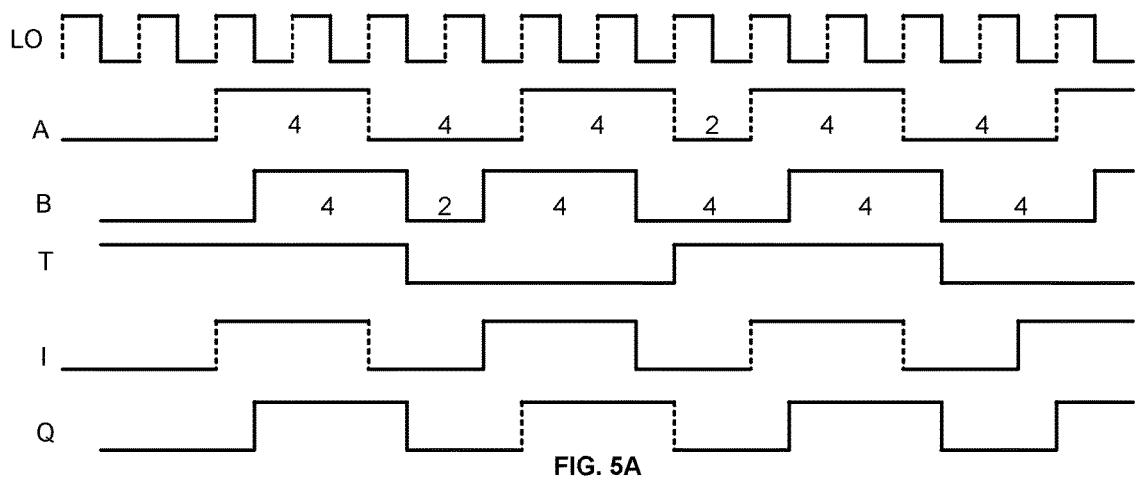
FIG. 5A depicts a timing diagram that illustrates operation of the DTC of FIG. 5.

In one embodiment, a counter control signal generated by the counter circuitry 520*b* specifies a number of LO signal half periods to be counted before transitioning signal states. The flip flops 557, 559 are triggered by positive or negative edges, respectively, of the LO signal to sample the signal output by the counter 555 and thus retime the signal output by the counter 555 to reduce jitter. The output of the flip flop 557 is the first series of pulses (signal A) that are aligned with positive edges of the LO signal. The output of the flip flop 559 is the second series of pulses (signal B) that are aligned with negative edges of the LO signal. FIG. 5A is a timing diagram that illustrates the two pulse series A and B that are output by the counter 555 in response to the counter control signal that includes the series of integers illustrated in FIG. 5. Pulses from either series A or B will selected for the edge signals I and Q by a selector signal T as will be described in more detail below.

Division control circuitry includes selector control circuitry 520*c* that is configured to control selector circuitry 560 to receive the first series of pulses A and the second series of pulses B and output a first edge signal I and a second edge signal Q. As can be seen in FIG. 5A, each resulting edge signal I, Q, is made up of pulses selected alternately from the first series of pulses A and the second series of pulses B, such that each edge signal comprises a pulse aligned with a positive edge of the LO signal followed by a pulse aligned with a negative edge of the LO signal. Returning again to FIG. 5, the MMD 540 includes the DCEI 370 that is configured to interpolate between edges in the first edge signal I and the second edge signal Q based at least on the phase control signal (e.g., the LSBs of the phase control signal φC) to generate the phase-modulated signal.

The selector circuitry 560 includes a first multiplexer (MUX) 562 configured to select either the first series of pulses A (in response to an input of 0) or the second series of pulses B (in response to an input of 1) to generate the first edge signal I. A second MUX 564 is configured to select either the first series of pulses A (in response to an input of 1) or the second series of pulses B (in response to an input of 0) to generate the second edge signal Q. The selector control circuitry 520*c* is configured to control the MUXs by inputting either a 0 or 1 to both MUXs. When the selector control circuitry 520*c* inputs a 0 to the MUXs, the first MUX 562 selects the first series of pulses and the second MUX 564 selects the second series of pulses. When the selector control circuitry 520*c* inputs a 1 to the MUXs, the first MUX 562 selects the second series of pulses B and the second MUX 564 selects the first series of pulses A.

Figure 5B:
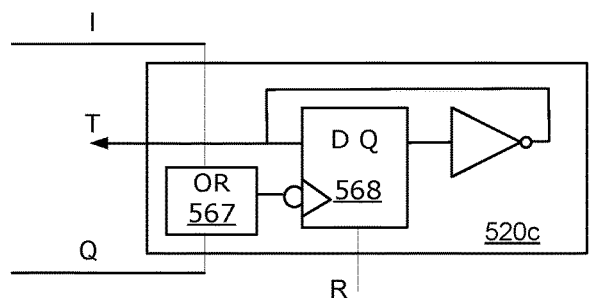
FIG. 5B illustrates one example embodiment of toggle circuitry of the DTC of FIG. 5.

The MUX control signal output by the selector control circuitry 520*c* is shown in FIG. 5A. It can be seen that the MUX control signal changes state on the latter of the falling edges of the I and Q pulses. FIG. 5B illustrates one embodiment of the toggle circuitry 566. The selector control circuitry 520*c* includes a toggle flip flop 568 that is triggered to change states when neither the I nor the Q signal is high. The output of the toggle flip flop T controls the MUXs 562, 564 of FIG. 5.

Note that integer N division may also be performed by the MMD 540 in the following manner. The frequency of the LO signal is controlled by division control circuitry to be equal to N*$f_{out}$. Counter circuitry 520*b* provides a different sequence of integers to the counter 555 to generate pulses having the proper width. Selector circuitry 520*c* keeps the MUX control signal static so that the output of the MUX 562 (edge signal I) is fixed as signal A and the output of the MUX 564 (edge signal Q) is fixed as signal B (or vice versa). Thus the MMD 540 may be controlled by division control circuitry, including the counter circuitry 520*b* and selector circuitry 520*c*, to perform a divide by N+/−1 or N.5+/−1 operation.

Figure 6A:
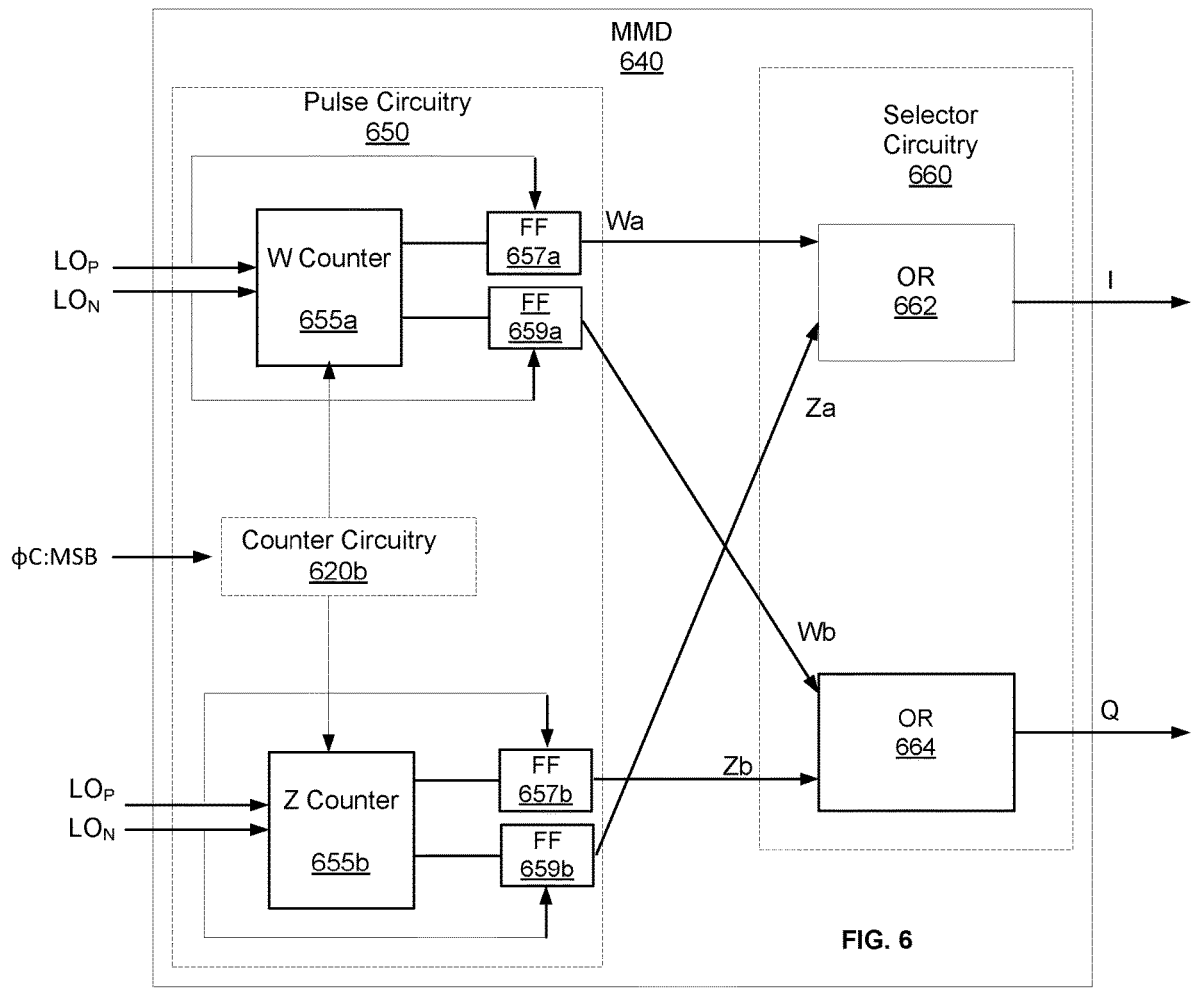
FIG. 6A depicts a timing diagram that illustrates operation of the DTC of FIG. 6.
Figure 6A:
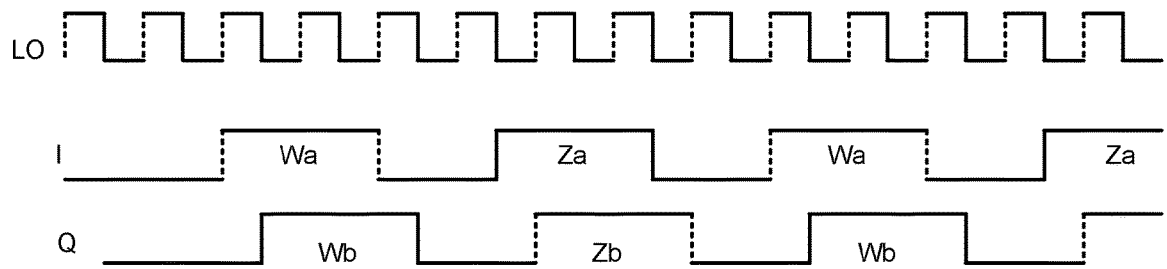

FIG. 6 illustrates another embodiment of an MMD 640 that performs an N.5+/−1 division operation on an LO signal. The MMD 640 includes pulse circuitry 650 having two counters 655*a*, 655*b* with associated flip flops 657, 659 that function in a manner similar to the counter 555 and flip flops 557, 559 of FIG. 5. As controlled by counter circuitry 620*b*, each of the counters 655*a*, 655*b* generates a first series of pulses (pulse signals Wa, Zb, respectively) having edges aligned with positive edges of the LO signal (LO$_P$) and a second series of pulses (pulse signals Wb, Za, respectively) having edges aligned with negative edges (LO$_N$) of the LO signal. The counter circuitry 620*b* generates a counter control signal that controls the counters 655*a*, 655*b* to generate pulse signals Wa, Wb, Za, Zb so that that each pulse signal includes pulses having a selected width and has an average frequency of $f_{out}$/2. In one embodiment, the counter control signal is generated based at least on the MSBs of the phase control signal φC.

Selector circuitry 660 includes a first OR circuitry 662 configured to perform a logical OR operation on the pulse signals Wa and Za and a second OR circuitry 664 configured to perform a logical OR operation on the pulse signals Wb and Zb. FIG. 6A illustrates a timing diagram that shows the first edge signal I including alternating pulses selected from the pulse signal Wa which is aligned with rising edges of the LO signal and the pulse signal Za which is aligned with falling edges of the LO signal. Similarly, the second edge signal Q includes alternating pulses selected from the pulse signal Zb which is aligned with rising edges of the LO signal and the pulse signal Wb which is aligned with falling edges of the LO signal.

Figure 7:
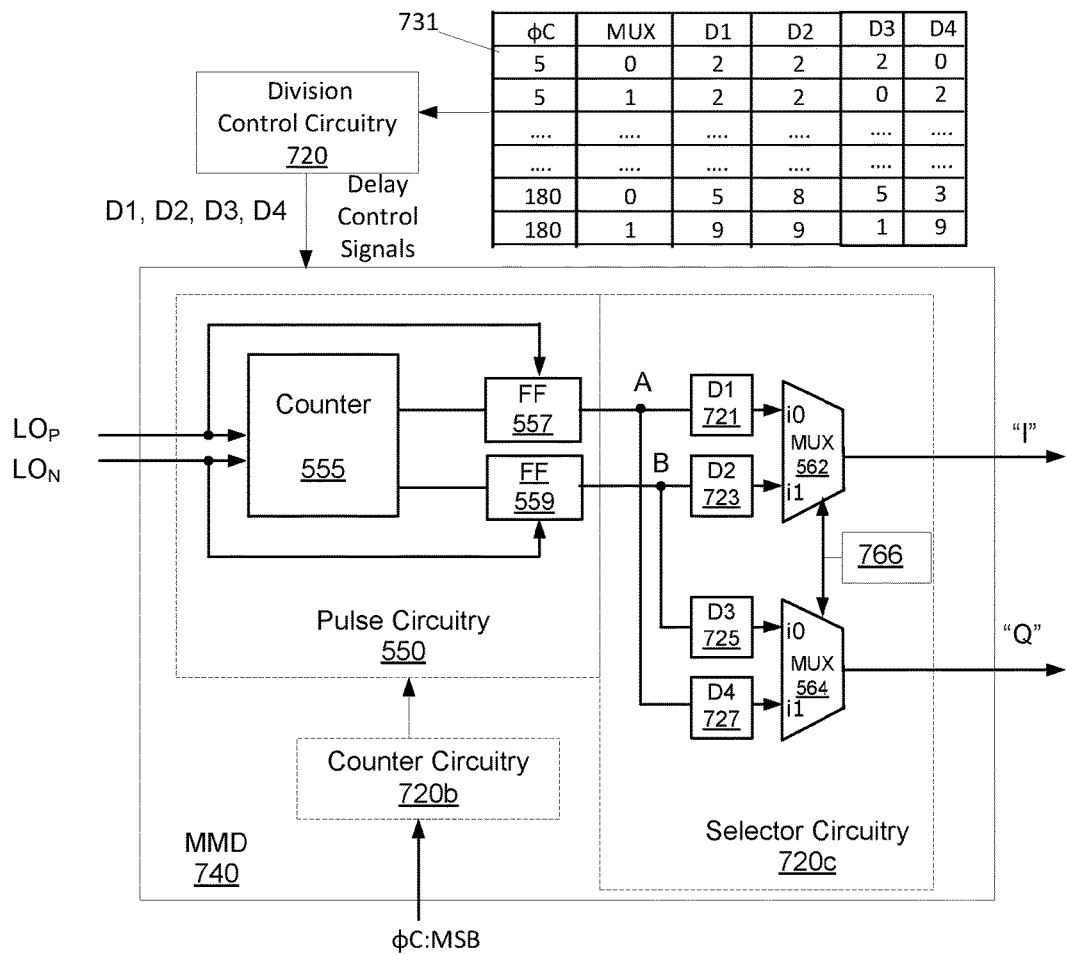
FIG. 7 illustrates one example embodiment of the DTC of the modulation circuitry of FIG. 5.

FIG. 7 illustrates one embodiment of an MMD 740 that performs a divide by N.5+/−1 operation and also includes delay cells 721, 723, 725, 727 that mitigate spurs that occur at 0.5 and 1.5 times $f_{out}$ by correcting mismatch between the timing of the I and Q signals that cause such spurs. Each delay cell can be based on an array of switched capacitors that can be turned on or off to change an amount of delay introduced by the delay cell into the signal path. The adjustable delay cells allow for the signal delay for the different signal paths in the selector circuitry 720*c* to be matched. The amount of delay (e.g., the number of capacitors turned on) for each cell is controlled by delay control signals generated by division control circuitry 720 based on the phase control signal φC. In one embodiment, the correct delay settings can be found using DTC calibration circuitry (not shown) which is already used to find and predistort the DTC signals for integral non linearity (INL) correction.

In one embodiment, the division control circuitry 720 is configured to access a predistortion lookup table 731 already used for INL correction. The lookup table 731 maps a phase control signal φC and MUX control signal (either 0 or 1) to numbers that control the amount of delay introduced by the delay cells 721, 723, 725, 727. In other embodiments, the division control circuitry 720 is configured to toggle between two different delay values for each delay cell based on the phase control signal φC.

Figure 8:
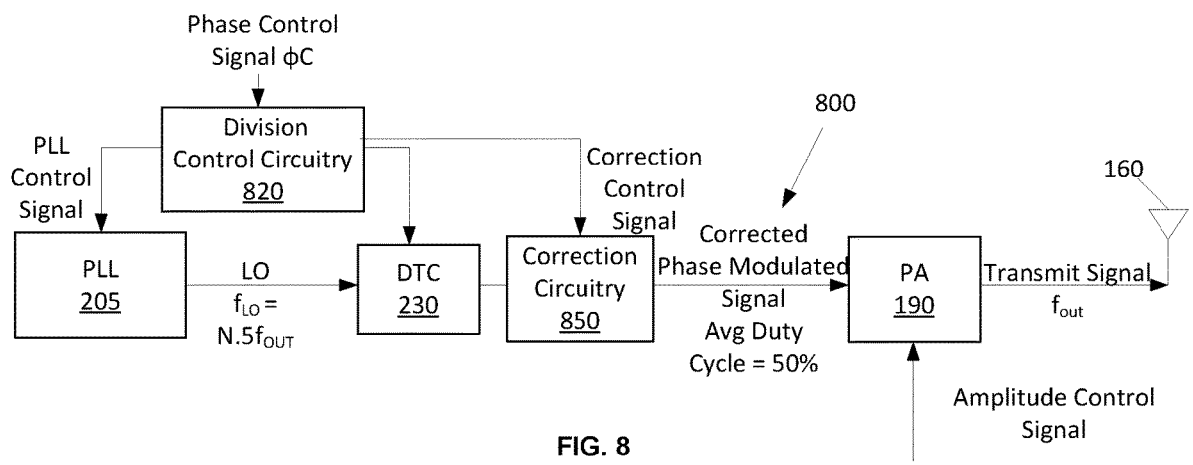
FIG. 8 illustrates another embodiment of the polar transmitter of FIG. 2 that includes correction circuitry configured correct a duty cycle of a phase modulated signal output by the modulation circuitry.

FIG. 8 illustrates one embodiment of a transmitter 800 that includes the DTC 230 that is configured to perform a divide by N.5+/−1 operation on the LO signal. The transmitter 800 includes division control circuitry 820 and correction circuitry 850. The correction circuitry 850 is configured to be controlled by a correction control signal generated by the division control circuitry 820 to correct the duty cycle of the phase modulated signal output by the DTC 230 so that the phase modulated signal has an average duty cycle of 50%. Note that the edge signals I and Q in FIGS. 4, 5A, and 6A have a duty cycle that is not 50%. For example, for division by 3.5, the nominal duty cycle is 4/7. This non-50% duty cycle increases the level of the second harmonic, which can generate interference. The correction circuitry 850 is configured to perform a constant correction of the duty cycle. The amount of duty cycle correction to be applied may be calculated by the division control circuitry 830 from the output frequency (i.e., the desired pulse width being $0.5/f_{out}$) and the pulse width of the DTC signals for the division factor being used (e.g., in FIG. 4, the pulse width is 2 LO periods). The duty cycle correction can be calculated by the division control circuitry 820 and applied to the DTC output waveform by the correction circuitry 850.

Figures 9A, 9B:
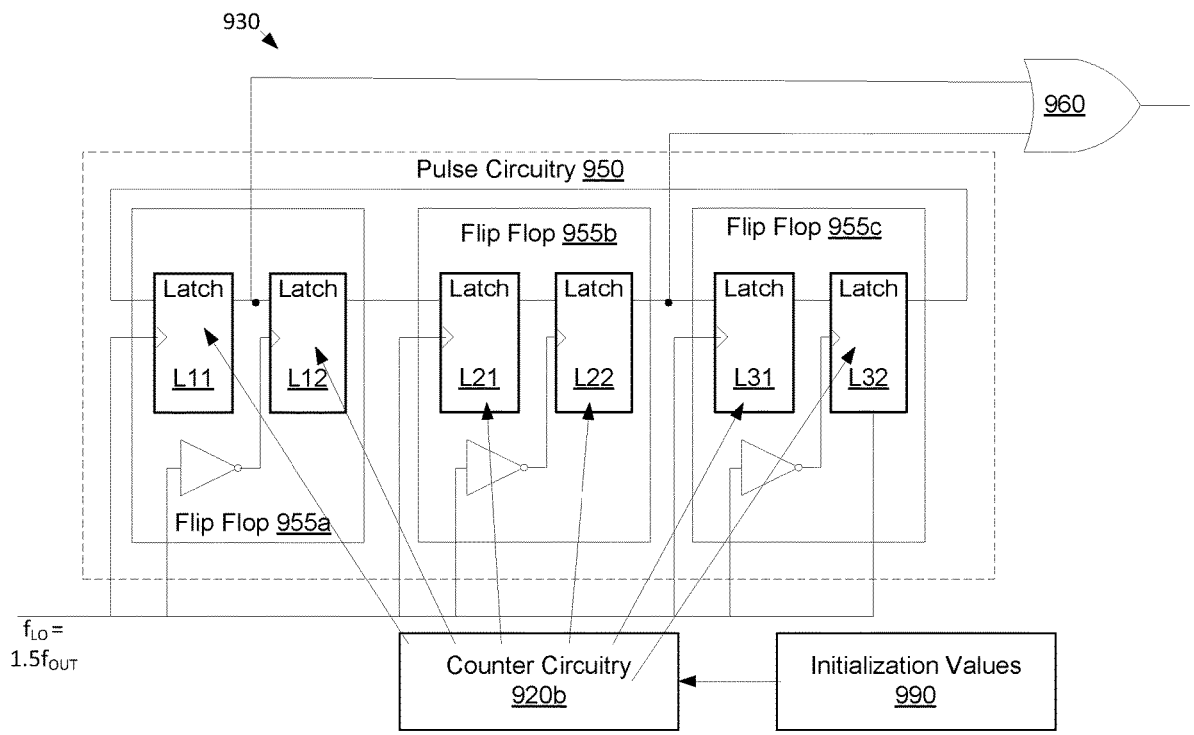
FIG. 9A illustrates one embodiment of the modulation circuitry of FIG. 2.
FIG. 9B illustrates a table showing initialization values for the modulation circuitry of FIG. 9A.

FIG. 9A illustrates another embodiment of a divider 930 configured to perform a fixed divide by 1.5 operation on an LO signal. Thus, the divider 930 is suitable for use in modulation circuitry in which the PLL is performing phase modulation. The divider 930 does not provide the capability to divide by 1.5+/−1 with the same LO signal as do the embodiments illustrated in FIGS. 3-8. However, in many instances, such as when the PLL is performing phase modulation, a fixed N.5 division operation is desirable. For example, a fixed N.5 division operation reduces pulling between the PLL and the power amplifier. A single PLL may be used to generate several different frequency bands by performing divide by 1.5, 2, 2.5, 3, 3.5, and so on. When two different transmit signals are being transmitted at the same frequency, generating each transmit signal by a different frequency division N.5 and M.5 reduces the pulling effect the PLL signals have on each other.

The divider 930 includes a counter 950 and selector circuitry 960 (e.g., OR circuitry in the illustrated embodiment). The counter 950 is a ring shift register comprising a series of latch elements L11-L32. Each pair of latch elements makes up a corresponding flip flop 955*a*-955*c*. In other embodiments, other types of latch elements may be used. Alternating latch elements L11, L21, and L31 are clocked by the positive edge of the LO signal and will produce pulses aligned with the positive edge of the LO signal. The remaining latch elements L12, L22, and L32 are clocked by the negative edge of the LO signal and will produce pulses aligned with the negative edge of the LO signal. The selector circuitry 960 receives pulses aligned with the positive edge of the LO signal from the latch element L22 and pulses aligned with the negative edge of the LO signal from the latch element L11. Counter circuitry 920*b* controls the counter to generate the desired divide by N.5 operation by initializing values stored in the latch elements. To do this, the counter circuitry 920*b* may access stored initialization values 990. An example of initialization values are illustrated in the table 990 of FIG. 9B, which also includes clock pulse edge values and OR output values. It can be seen that the sets of consecutive "True" values for the OR output are alternately aligned with the rising edge of the clock signal and then the falling edge of the clock signal. The duty cycle of the edge signal produced by the divider 930 is 2:1. The counter circuitry 920*b* can control the duty cycle of the edge signal by changing the initialization values.

Figures 10A, 10B, 10C:
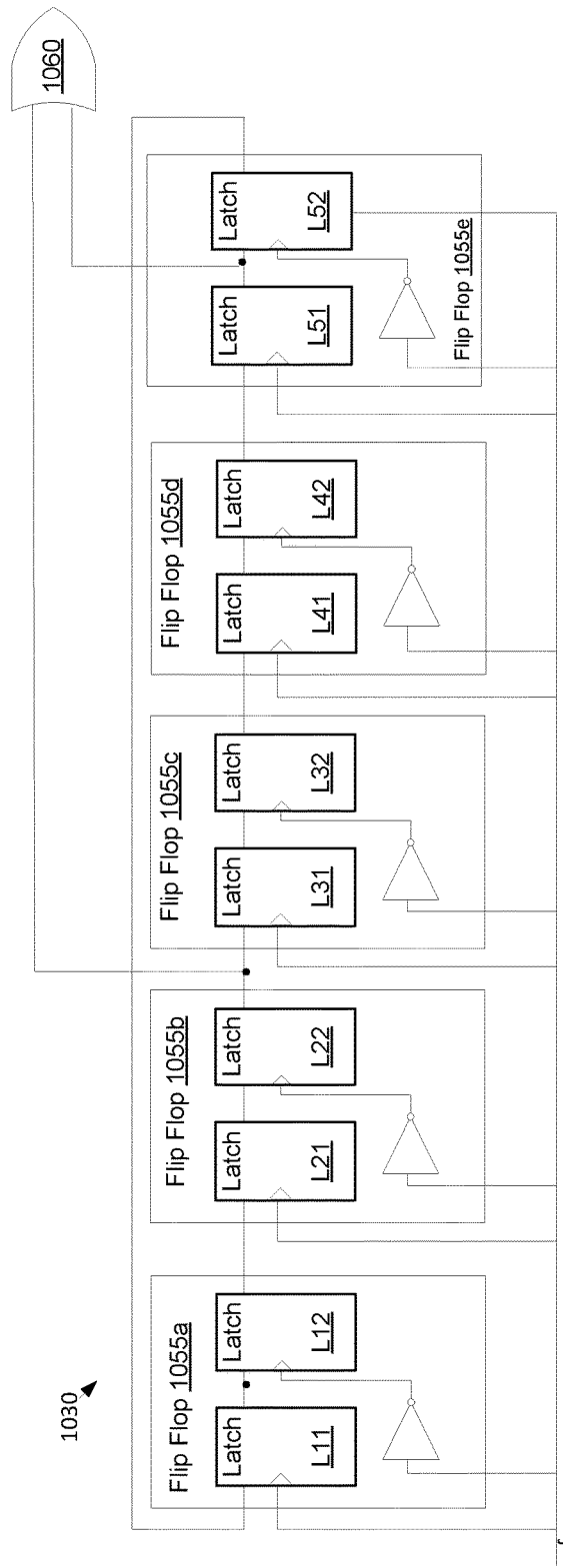

FIG. 10A illustrates another embodiment of a DTC 1030 configured to perform a divide by 2.5 operation on an LO signal. The DTC 1030 includes a counter 1050 and selector circuitry 1060 (e.g., OR circuitry in the illustrated embodiment). The counter 1050 is a ring shift register comprising a series of latch elements L11-L52. Each pair of latch elements makes up a corresponding flip flop 1055*a*-1055*e*. In other embodiments, other types of latch elements may be used. Alternating latch elements L11, L21, L31, L41, and L51 are clocked by the positive edge of the LO signal and will produce pulses aligned with the positive edge of the LO signal. The remaining latch elements L12, L22, L32, L42, and L52 are clocked by the negative edge of the LO signal and will produce pulses aligned with the negative edge of the LO signal.

The selector circuitry 1060 receives pulses aligned with the positive edge of the LO signal from the latch element L22 and pulses aligned with the negative edge of the LO signal from the latch element L51. Counter circuitry not shown controls the counter to generate the divide by 2.5 operation by initializing values stored in the latch elements. To do this, the counter circuitry may access stored initialization values 1090. An example of initialization values are illustrated in the table 1090B and 1090C of FIGS. 10B, 10C which also include clock pulse edge values and OR output values. It can be seen that the sets of consecutive "True" values for the OR output are alternately aligned with the rising edge of the clock signal and then the falling edge of the clock signal. The duty cycle of the edge signal produced by the DTC 1030 when it is initialized with the values in table 1090*a* is 2:3. The duty cycle of the edge signal produced by the DTC 1030 when it is initialized with the values in table 1090*b* is 1:4. FIG. 10C illustrates initialization values for an edge signal having a duty cycle of 3:2 that can be generated by the DTC of FIG. 10A with the OR circuitry 1060 replaced by AND circuitry (not shown).

Figure 12:
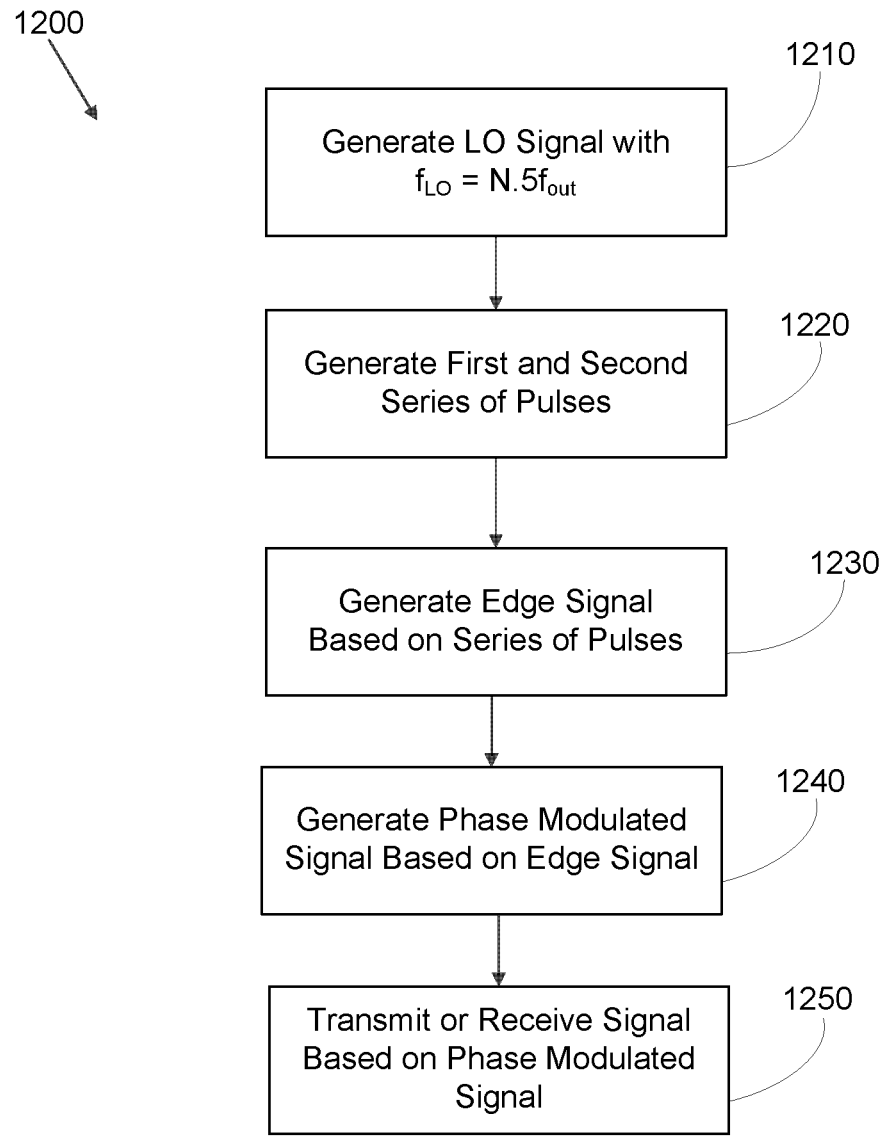
FIG. 12 illustrates a flowchart that outlines a method for generating edge signals corresponding to N.5+/−1 division of an LO signal.

FIG. 11 illustrates a table 1190 showing initialization values for a DTC that includes a series of latches L11-L72 and OR selector circuitry, not shown, that will generate an edge signal that performs a divide by 3.5 operation on an LO signal. FIG. 12 depicts a flowchart outlining one embodiment of a method 1200 that performs division by N.5+/−1. At 1210, the method includes generating an LO signal with a frequency that is N.5 times the output frequency. At 1220, a first series of pulses and a second series of pulses based are generated based on the LO signal and a value of N. An edge signal is generated based on the first series of pulses and the second series of pulses at 1230. The edge signal includes a pulse aligned with a positive edge of the LO signal followed by a pulse aligned with a negative edge of the LO signal. At 1240, the method includes generating the phase modulated signal based on the edge signal; and at 1250 a signal is transmitted or received based on the phase modulated signal.

In one embodiment, the method includes generating, based on a phase control signal, the first series of pulses having edges aligned with positive edges of the LO signal and the second series of pulses having edges aligned with negative edges of the LO signal. In this embodiment, the method includes generating a first edge signal and a second edge signal, wherein each edge signal includes pulses selected alternately from the first series of pulses and the second series of pulses, such that each edge signal includes a pulse aligned with a positive edge of the LO signal followed by a pulse aligned with a negative edge of the LO signal. The first edge signal may be generated by alternately selecting either the first series of pulses or the second series of pulses; and the second edge signal may be generated by alternately selecting an other of the first series of pulses or the second series of pulses. Alternatively a third series of pulses having edges aligned with positive edges of an LO signal and a fourth series of pulses having edges aligned with negative edges of the LO signal may be generated, in which case the method includes performing a logical OR operation on the first series of pulses and the fourth series of pulses to generate the first edge signal; and performing a logical OR operation on the second series of pulses and the third series of pulses to generate the second edge signal.

In one embodiment, the method includes operating in a second mode that includes generating the first edge signal corresponding to the first series of pulses; generating the second edge signal corresponding to the second series of pulses. Thus, one of the first edge signal and the second edge signal includes pulses aligned with a positive edge of the LO signal and the other of the first edge signal and the second edge signal includes pulses aligned with a negative edge of the LO signal.

In one embodiment, the method includes generating the first pulse series and the second pulse series by initializing contents of latch elements in a series of latch elements based on a desired N.5 division operation; clocking alternating latch elements in the series of latch elements with positive edges of the LO signal to generate the first series of pulses aligned with the positive edges of the LO signal; and clocking remaining latch elements in the series of latch elements with negative edges of the LO signal to generate the second series of pulses aligned with the negative edges of the LO signal. The edge signal is generated by combining pulses from a first latch element that is clocked by the positive edges of the LO signal with pulses from a second latch element that is clocked by the negative edges of the LO signal.

It can be seen from the foregoing description that the described division control circuitry enables division by N.5+/−1 to minimize spurs and oscillator pulling. The division control circuitry does not utilize a phase ramp within the DTC, thereby reducing the risk of spurs due to periodic repetition of DTC imperfections due to the phase ramp. In one embodiment, the division control circuitry enables division by N.5+/−1 or division by N+/−1, in a flexible, selectable manner.

Figure 13:
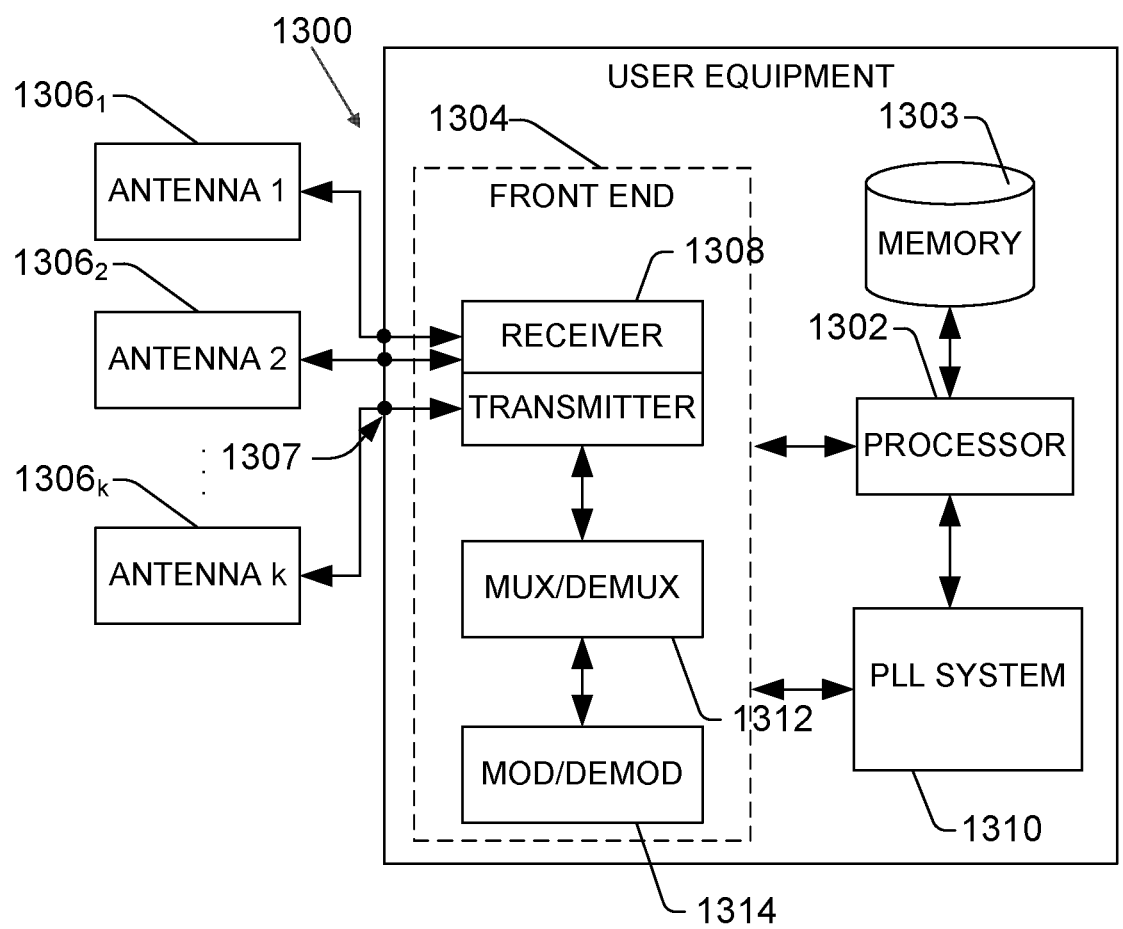
FIG. 13 illustrates an example user equipment device that includes a transceiver front end that utilizes N.5+/−1 division, according to one embodiment of the disclosure.

To provide further context for various aspects of the disclosed subject matter, FIG. 13 illustrates a block diagram of an embodiment of user equipment 1300 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 1300 can be utilized with one or more aspects of the DTC based pulse generation techniques described herein according to various aspects. The user equipment device 1300, for example, comprises a digital baseband processor 1302 that can be coupled to a data store or memory 1303, a front end 1304 (e.g., an RF front end, an acoustic front end, or the other like front end) and a plurality of antenna ports 1307 for connecting to a plurality of antennas $1306_1$ to $1306_K$ (K being a positive integer). The antennas $1306_1$ to $1306_K$ can receive and transmit signals to and from one or more wireless devices such as access points, access terminals, wireless ports, routers and so forth, which can operate within a radio access network or other communication network generated via a network device (not shown).

The user equipment 1300 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 1304 can include a communication platform, which comprises electronic components and associated circuitry that provide for processing, manipulation or shaping of the received or transmitted signals via one or more receivers or transmitters (e.g. transceivers) 1308, a mux/demux component 1312, and a mod/demod component 1314. The front end 1304 is coupled to the digital baseband processor 1302 and the set of antenna ports 1307, in which the set of antennas $1306_1$ to $1306_K$ can be part of the front end. In one aspect, the user equipment device 1300 can comprise a phase locked loop system 1310.

The processor 1302 can confer functionality, at least in part, to substantially any electronic component within the mobile communication device 1300, in accordance with aspects of the disclosure. As an example, the processor 1302 can be configured to execute, at least in part, executable instructions that select one or more codes that will cause division by N.5+/−1 as disclosed in FIGS. 1-9. Thus the processor 1302 may embody various aspects of the division control circuitry 220, 320, 520a/520b, 720, 820 of FIGS. 2-9, as a multi-mode operation chipset that generates pulse based signals.

The processor 1302 is functionally and/or communicatively coupled (e.g., through a memory bus) to memory 1303 in order to store or retrieve information necessary to operate and confer functionality, at least in part, to communication platform or front end 1304, the phase locked loop system 1310 and substantially any other operational aspects of the phase locked loop system 1310. The phase locked loop system 1310 includes at least one oscillator (e.g., a VCO, DCO or the like) that can be calibrated via core voltage, a coarse tuning value, signal, word or selection process.

The processor 1302 can operate to enable the mobile communication device 1300 to process data (e.g., symbols, bits, or chips) for multiplexing/demultiplexing with the mux/demux component 1312, or modulation/demodulation via the mod/demod component 1314, such as implementing direct and inverse fast Fourier transforms, selection of modulation rates, selection of data packet formats, inter-packet times, etc. Memory 1303 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation. In one embodiment, memory 1303 stores one or more lookup tables that map phase control signals and selector values to delay values as described in FIG. 7.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is modulation circuitry adapted for generation of a phase modulated signal based on an N.+0.5 (N.5) division operation used in mobile communication. The modulation circuitry includes a phase locked loop (PLL) configured to generate a local oscillator (LO) signal comprising a frequency that is N.5 times an output frequency of the phase modulated signal and pulse circuitry configured to generate, based at least on a value of N, an edge signal comprising a pulse aligned with a positive edge of the LO signal and a pulse aligned with a negative edge of the LO signal.

Example 2 includes the subject matter of example 1, including or omitting optional elements, wherein the pulse circuitry includes a counter configured to generate a first series of pulses and a second series of pulses based on the LO signal and the modulation circuitry further includes selector circuitry configured to receive the first series of pulses and the second series of pulses and generate the edge signal based on the first series of pulses and the second series of pulses.

Example 3 includes the subject matter of example 2, including or omitting optional elements, wherein the selector circuitry includes a first multiplexer (MUX) configured to select either the first series of pulses or the second series of pulses to generate a first edge signal and a second MUX configured to select either the first series of pulses or the second series of pulses to generate a second edge signal. The modulation circuitry includes selector control circuitry configured to control the first MUX to select the first series of pulses and the second MUX to select the second series of pulses or the first MUX to select the second series of pulses and the second MUX to select the first series of pulses.

Example 4 includes the subject matter of example 2, including or omitting optional elements, wherein: the pulse circuitry includes a second counter configured to generate, based at least on the counter control signal, a third series of pulses having edges aligned with positive edges of an LO signal and a fourth series of pulses having edges aligned with negative edges of the LO signal. The selector circuitry includes: first OR circuitry configured to perform a logical OR operation on the first series of pulses and the fourth series of pulses to generate the first edge signal; and second OR circuitry configured to perform a logical OR operation on the second series of pulses and the third series of pulses to generate the second edge signal.

Example 5 includes the subject matter of examples 2-4, including or omitting optional elements, wherein the PLL is configured to operate in a second mode in which the PLL generates an LO signal having a frequency that is N.0 times the output frequency. The selector circuitry is configured to operate in either a first mode or a second mode. In the first mode the selector circuitry outputs edge signals including pulses selected alternately from the first series of pulses and the second series of pulses, such that each edge signal includes a pulse aligned with a positive edge of the LO signal followed by a pulse aligned with a negative edge of the LO signal. In the second mode the selector circuitry outputs a first edge signal corresponding to the first series of pulses and a second edge signal corresponding to the second series of pulses, such that one of the first edge signal and the second edge signal includes pulses aligned with a positive edge of the LO signal and the other of the first edge signal and the second edge signal includes pulses aligned with a negative edge of the LO signal.

Example 6 includes the subject matter of example 2, including or omitting optional elements, wherein the pulse circuitry includes a series of latch elements, wherein alternating latch elements in the series are clocked by positive edges of the LO signal to generate pulses aligned with the positive edges of the LO signal with the remaining latch elements being clocked by negative edges of the LO signal to generate pulses aligned with the negative edges of the LO signal. The modulation circuitry includes counter circuitry configured to initialize contents of the latch elements based on the desired N.5 division operation. The selector circuitry combines pulses from a first latch element that is clocked by the positive edges of the LO signal and pulses from a second latch element that is clocked by the negative edges of the LO signal.

Example 7 is a method to generate a phase modulated signal having an output frequency that corresponds to an LO signal divided by N.5, including generating an LO signal with a frequency that is N.5 times the output frequency; generating a first series of pulses and a second series of pulses based on the LO signal and a value of N; generating an edge signal based on the first series of pulses and the second series of pulses, wherein the edge signal includes a pulse aligned with a positive edge of the LO signal and a pulse aligned with a negative edge of the LO signal; generating the phase modulated signal based on the edge signal; and transmitting or receiving a signal based on the phase modulated signal.

Example 8 includes the subject matter of example 7, including or omitting optional elements, further including generating, based on a phase control signal, the first series of pulses having edges aligned with positive edges of the LO signal and the second series of pulses having edges aligned with negative edges of the LO signal and generating a first edge signal and a second edge signal, wherein each edge signal includes pulses selected alternately from the first series of pulses and the second series of pulses, such that each edge signal includes a pulse aligned with a positive edge of the LO signal followed by a pulse aligned with a negative edge of the LO signal.

Example 9 includes the subject matter of example 8, including or omitting optional elements, including generating the first edge signal by alternately selecting either the first series of pulses or the second series of pulses and generating the second edge signal by alternately selecting another of the first series of pulses or the second series of pulses.

Example 10 includes the subject matter of example 8, including or omitting optional elements, including: generating a third series of pulses having edges aligned with positive edges of an LO signal; generating a fourth series of pulses having edges aligned with negative edges of the LO signal; and performing a logical OR operation on the first series of pulses and the fourth series of pulses to generate the first edge signal; and performing a logical OR operation on the second series of pulses and the third series of pulses to generate the second edge signal.

Example 11 includes the subject matter of examples 7-10, including or omitting optional elements, including operating in a second mode by generating a second LO signal having a frequency that is N.0 times the output frequency; generating the first edge signal corresponding to the first series of pulses; generating the second edge signal corresponding to the second series of pulses; such that one of the first edge signal and the second edge signal includes pulses aligned with a positive edge of the LO signal and the other of the first edge signal and the second edge signal includes pulses aligned with a negative edge of the LO signal.

Example 12 includes the subject matter of examples 7-10, including or omitting optional elements, further including receiving the phase modulated signal and generating, based at least on a correction control signal, a corrected phase modulated signal having an average duty cycle of 50%, wherein the correction control signal is based at least on the output frequency.

Example 13 includes the subject matter of examples 7-10, including or omitting optional elements, wherein: generating the first pulse series and the second pulse series includes initializing contents of latch elements in a series of latch elements based on a desired N.5 division operation; clocking alternating latch elements in the series of latch elements with positive edges of the LO signal to generate the first series of pulses aligned with the positive edges of the LO signal; and clocking remaining latch elements in the series of latch elements with negative edges of the LO signal to generate the second series of pulses aligned with the negative edges of the LO signal. Generating the edge signal includes combining pulses from a first latch element that is clocked by the positive edges of the LO signal with pulses from a second latch element that is clocked by the negative edges of the LO signal.

Example 14 includes the subject matter of examples 7-10, including or omitting optional elements, including performing a logical OR operation on the pulses from the first latch element and the pulses from the second latch element.

Example 15 is modulation circuitry configured to generate a phase modulated signal having an output frequency that corresponds to an LO signal divided by N.5, including pulse circuitry, selector circuitry, and division control circuitry. The pulse circuitry includes a counter configured to generate a first series of pulses and a second series of pulses based on the LO signal. The selector circuitry is configured to receive the first series of pulses and the second series of pulses and generate an edge signal including a pulse aligned with a positive edge of the LO signal followed by a pulse aligned with a negative edge of the LO signal. The division control circuitry includes PLL control circuitry configured to control a phase locked loop (PLL) to generate the LO signal with a frequency that is N.5 times the output frequency and counter circuitry configured to control the counter based at least on a value of N.

Example 16 includes the subject matter of example 15, including or omitting optional elements, wherein the counter is configured to generate a first series of pulses having edges aligned with positive edges of the LO signal and a second series of pulses having edges aligned with negative edges of the LO signal. The counter circuitry is configured to control the counter based at least on a phase control signal. The selector circuitry is configured to input the first series of pulses and the second series of pulses and generate a first edge signal and a second edge signal, wherein each edge signal includes pulses selected alternately from the first series of pulses and the second series of pulses, such that each edge signal includes a pulse aligned with a positive edge of the LO signal followed by a pulse aligned with a negative edge of the LO signal.

Example 17 includes the subject matter of example 16, including or omitting optional elements, wherein the selector circuitry includes a first multiplexer (MUX) configured to select either the first series of pulses or the second series of pulses to generate the first edge signal and a second MUX configured to select either the first series of pulses or the second series of pulses to generate the second edge signal. The division control circuitry includes selector control circuitry configured to control the first MUX to select the first series of pulses and the second MUX to select the second series of pulses or the first MUX to select the second series of pulses and the second MUX to select the first series of pulses.

Example 18 includes the subject matter of example 16, including or omitting optional elements, wherein the pulse circuitry includes a second counter configured to generate, based at least on the counter control signal, a third series of pulses having edges aligned with positive edges of an LO signal and a fourth series of pulses having edges aligned with negative edges of the LO signal and the selector circuitry includes: first OR circuitry configured to perform a logical OR operation on the first series of pulses and the fourth series of pulses; and second OR circuitry configured to perform a logical OR operation on the second series of pulses and the third series of pulses.

Example 19 includes the subject matter of example 16, including or omitting optional elements, wherein the selector circuitry includes a delay cell arranged in each path between the pulse circuitry and an output of the selector circuitry and the division control circuitry is configured to generate control signals that control each delay cell to delay an edge signal by a delay value.

Example 20 includes the subject matter of example 16, including or omitting optional elements, wherein the PLL is configured to operate in a second mode in which the PLL generates an LO signal having a frequency that is N.0 times the output frequency. The selector circuitry is configured to select between a first mode and a second mode. In the first mode the selector circuitry outputs edge signals including pulses selected alternately from the first series of pulses and the second series of pulses, such that each edge signal includes a pulse aligned with a positive edge of the LO signal followed by a pulse aligned with a negative edge of the LO signal. In the second mode the selector circuitry outputs a first edge signal corresponding to the first series of pulses and a second edge signal corresponding to the second series of pulses, such that one of the first edge signal and the second edge signal includes pulses aligned with a positive edge of the LO signal and the other of the first edge signal and the second edge signal includes pulses aligned with a negative edge of the LO signal.

Example 21 includes the subject matter of example 16, including or omitting optional elements, further including an edge interpolator configured to interpolate between edges in the first edge signal and the second edge based at least on the phase control signal to generate the phase-modulated signal.

Example 22 includes the subject matter of examples 15-21, including or omitting optional elements, further including correction circuitry configured to input the phase modulated signal and generate, based at least on a correction control signal, a corrected phase modulated signal having an average duty cycle of 50%, further wherein the division control circuitry is configured to generate the correction control signal based at least on the output frequency.

Example 23 includes the subject matter of examples 15-21, including or omitting optional elements, wherein the counter includes a series of latch elements, wherein alternating latch elements in the series are clocked by positive edges of the LO signal to generate pulses aligned with the positive edges of the LO signal with the remaining latch elements being clocked by negative edges of the LO signal to generate pulses aligned with the negative edges of the LO signal. The counter circuitry is configured to initialize contents of the latch elements based on the desired N.5 division operation. The selector circuitry combines pulses from a first latch element that is clocked by the positive edges of the LO signal and pulses from a second latch element that is clocked by the negative edges of the LO signal.

Example 24 includes the subject matter of example 23, including or omitting optional elements, wherein the counter circuitry is configured to initialize contents of the latch elements based on the desired duty cycle of the edge signal.

Example 25 includes the subject matter of example 23, including or omitting optional elements, wherein the selector circuitry includes OR circuitry configured to perform a logical OR operation on the pulses from the first latch element and the pulses from the second latch element.

Example 26 is an apparatus to generate a phase modulated signal having an output frequency that corresponds to an LO signal divided by N.5, including means for generating an LO signal with a frequency that is N.5 times the output frequency; means for generating a first series of pulses and a second series of pulses based on the LO signal and a value of N; means for generating an edge signal based on the first series of pulses and the second series of pulses, wherein the edge signal includes a pulse aligned with a positive edge of the LO signal followed by a pulse aligned with a negative edge of the LO signal; means for generating the phase modulated signal based on the edge signal; and means for transmitting or receiving a signal based on the phase modulated signal.

Example 27 includes the subject matter of example 26, including or omitting optional elements, including means for operating in a second mode that includes: means for generating a second LO signal with a frequency that is N.0 times the output frequency; means for generating the first edge signal corresponding to the first series of pulses; means for generating the second edge signal corresponding to the second series of pulses; such that one of the first edge signal and the second edge signal includes pulses aligned with a positive edge of the LO signal and the other of the first edge signal and the second edge signal comprises pulses aligned with a negative edge of the LO signal.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

The invention claimed is:

1. Modulation circuitry adapted for generation of a phase modulated signal based on an N.+0.5 (N.5) division operation used in mobile communication, the modulation circuitry comprising:
   a phase locked loop (PLL) configured to generate a local oscillator (LO) signal comprising a frequency that is N.5 times an output frequency of the phase modulated signal; and
   pulse circuitry configured to generate, based at least on a value of N, an edge signal comprising a pulse aligned with a positive edge of the LO signal and a pulse aligned with a negative edge of the LO signal.

2. The modulation circuitry of claim 1, wherein:
   the pulse circuitry comprises a counter configured to generate a first series of pulses and a second series of pulses based on the LO signal; and
   the modulation circuitry further comprises selector circuitry configured to receive the first series of pulses and the second series of pulses and select pulses from the first series of pulses or the second series of pulses to generate the edge signal.

3. The modulation circuitry of claim 2, wherein the selector circuitry comprises:
   a first multiplexer (MUX) configured to select either the first series of pulses or the second series of pulses to generate a first edge signal; and
   a second MUX configured to select either the first series of pulses or the second series of pulses to generate a second edge signal; and
   wherein the modulation circuitry comprises selector control circuitry configured to control the first MUX to select the first series of pulses and the second MUX to select the second series of pulses or the first MUX to select the second series of pulses and the second MUX to select the first series of pulses.

4. The modulation circuitry of claim 2, wherein:
   the pulse circuitry comprises a second counter configured to generate, based at least on a counter control signal, a third series of pulses having edges aligned with positive edges of an LO signal and a fourth series of pulses having edges aligned with negative edges of the LO signal; and
   the selector circuitry comprises:
      first OR circuitry configured to perform a logical OR operation on the first series of pulses and the fourth series of pulses to generate a first edge signal; and
      second OR circuitry configured to perform a logical OR operation on the second series of pulses and the third series of pulses to generate a second edge signal.

5. The modulation circuitry of claim 2, wherein:
   the PLL is configured to operate in a first mode in which the PLL generates the LO signal having a frequency that is N.5 times the output frequency and a second mode in which the PLL generates an LO signal having a frequency that is N.0 times the output frequency;
   the selector circuitry is configured to selectively operate in a first mode in which the selector circuitry outputs edge signals comprising pulses selected alternately from the first series of pulses and the second series of pulses, such that each edge signal comprises a pulse aligned with a positive edge of the LO signal followed by a pulse aligned with a negative edge of the LO signal, and
   the selector circuitry is configured to selectively operate in a second mode in which the selector circuitry outputs a first edge signal corresponding to the first series of pulses and a second edge signal corresponding to the second series of pulses, such that one of the first edge signal and the second edge signal comprises pulses aligned with a positive edge of the LO signal and the other of the first edge signal and the second edge signal comprises pulses aligned with a negative edge of the LO signal.

6. The modulation circuitry of claim 2, wherein:
   the pulse circuitry comprises a series of latch elements, wherein alternating latch elements in the series are clocked by positive edges of the LO signal to generate pulses aligned with the positive edges of the LO signal with the remaining latch elements being clocked by negative edges of the LO signal to generate pulses aligned with the negative edges of the LO signal;
   the modulation circuitry comprises counter circuitry configured to initialize contents of the latch elements based on the desired N.5 division operation; and
   the selector circuitry combines pulses from a first latch element that is clocked by the positive edges of the LO signal and pulses from a second latch element that is clocked by the negative edges of the LO signal.

7. A method to generate a phase modulated signal comprising an output frequency that corresponds to a local oscillator (LO) signal divided by N.5, comprising:
   generating an LO signal with a frequency that is N.5 times the output frequency;
   generating a first series of pulses and a second series of pulses based on the LO signal and a value of N;
   generating an edge signal based on the first series of pulses and the second series of pulses, wherein the edge signal includes a pulse aligned with a positive edge of the LO signal and a pulse aligned with a negative edge of the LO signal;
   generating the phase modulated signal based on the edge signal; and
   transmitting or receiving a signal based on the phase modulated signal.

8. The method of claim 7, further comprising:
   generating, based on a phase control signal, the first series of pulses having edges aligned with positive edges of the LO signal and the second series of pulses having edges aligned with negative edges of the LO signal; and
   generating a first edge signal and a second edge signal, wherein each edge signal comprises pulses selected alternately from the first series of pulses and the second series of pulses, such that each edge signal comprises a pulse aligned with a positive edge of the LO signal followed by a pulse aligned with a negative edge of the LO signal.

9. The method of claim 8, further comprising:
generating the first edge signal by alternately selecting either the first series of pulses or the second series of pulses; and
generating the second edge signal by alternately selecting an other of the first series of pulses or the second series of pulses.

10. The method of claim 8, further comprising:
generating a third series of pulses having edges aligned with positive edges of an LO signal;
generating a fourth series of pulses having edges aligned with negative edges of the LO signal;
performing a logical OR operation on the first series of pulses and the fourth series of pulses to generate the first edge signal; and
performing a logical OR operation on the second series of pulses and the third series of pulses to generate the second edge signal.

11. The method of claim 7, further comprising operating in a second mode comprising:
generating a second LO signal with a frequency that is N.0 times the output frequency;
generating a first edge signal corresponding to the first series of pulses; and
generating a second edge signal corresponding to the second series of pulses;
such that one of the first edge signal and the second edge signal comprises pulses aligned with a positive edge of the LO signal and the other of the first edge signal and the second edge signal comprises pulses aligned with a negative edge of the LO signal.

12. The method of claim 7, further comprising receiving the phase modulated signal and generating, based at least on a correction control signal, a corrected phase modulated signal having an average duty cycle of 50%, wherein the correction control signal is based at least on the output frequency.

13. The method of claim 7, wherein:
generating the first series of pulses and the second series of pulses comprises:
initializing contents of latch elements in a series of latch elements based on a desired N.5 division operation;
clocking alternating latch elements in the series of latch elements with positive edges of the LO signal to generate the first series of pulses aligned with the positive edges of the LO signal; and
clocking remaining latch elements in the series of latch elements with negative edges of the LO signal to generate the second series of pulses aligned with the negative edges of the LO signal; and
generating the edge signal comprises combining pulses from a first latch element that is clocked by the positive edges of the LO signal with pulses from a second latch element that is clocked by the negative edges of the LO signal.

14. The method claim 13, further comprising performing a logical OR operation on the pulses from the first latch element and the pulses from the second latch element.

15. Modulation circuitry configured to generate a phase modulated signal having an output frequency that corresponds to an LO signal divided by N.5, comprising:
pulse circuitry comprising a counter configured to generate a first series of pulses and a second series of pulses based on the LO signal;
selector circuitry configured to receive the first series of pulses and the second series of pulses and generate an edge signal including a pulse aligned with a positive edge of the LO signal followed by a pulse aligned with a negative edge of the LO signal;
division control circuitry, comprising:
PLL control circuitry configured to control a phase locked loop (PLL) to generate the LO signal with a frequency that is N.5 times the output frequency;
counter circuitry configured to control the counter based at least on a value of N.

16. The modulation circuitry of claim 15, wherein:
the counter is configured to generate a first series of pulses having edges aligned with positive edges of the LO signal and a second series of pulses having edges aligned with negative edges of the LO signal;
the counter circuitry is configured to control the counter based at least on a phase control signal; and
the selector circuitry is configured to input the first series of pulses and the second series of pulses and generate a first edge signal and a second edge signal, wherein each edge signal comprises pulses selected alternately from the first series of pulses and the second series of pulses, such that each edge signal comprises a pulse aligned with a positive edge of the LO signal followed by a pulse aligned with a negative edge of the LO signal.

17. The modulation circuitry of claim 16, further comprising an edge interpolator configured to interpolate between edges in the first edge signal and the second edge based at least on the phase control signal to generate the phase-modulated signal.

18. The modulation circuitry of claim 16, wherein the selector circuitry comprises:
a first multiplexer (MUX) configured to select either the first series of pulses or the second series of pulses to generate the first edge signal; and
a second MUX configured to select either the first series of pulses or the second series of pulses to generate the second edge signal; and
wherein the division control circuitry comprises selector control circuitry configured to control the first MUX to select the first series of pulses and the second MUX to select the second series of pulses or the first MUX to select the second series of pulses and the second MUX to select the first series of pulses.

19. The modulation circuitry of claim 16, wherein:
the pulse circuitry comprises a second counter configured to generate, based at least on the counter control signal, a third series of pulses having edges aligned with positive edges of an LO signal and a fourth series of pulses having edges aligned with negative edges of the LO signal; and
the selector circuitry comprises:
first OR circuitry configured to perform a logical OR operation on the first series of pulses and the fourth series of pulses; and
second OR circuitry configured to perform a logical OR operation on the second series of pulses and the third series of pulses.

20. The modulation circuitry of claim 16, wherein:
the selector circuitry comprises a delay cell arranged in each path between the pulse circuitry and an output of the selector circuitry; and the division control circuitry is configured to generate control signals that control each delay cell to delay an edge signal by a delay value.

21. The modulation circuitry of claim 16, wherein:

the PLL is configured to operate in a second mode in which the PLL generates a second LO signal having a frequency that is N.0 times the output frequency;

the selector circuitry is configured to operate in a first mode in which the selector circuitry outputs edge signals comprising pulses selected alternately from the first series of pulses and the second series of pulses, such that each edge signal comprises a pulse aligned with a positive edge of the LO signal followed by a pulse aligned with a negative edge of the LO signal, and the selector circuitry is configured to operate in the second mode in which the selector circuitry outputs a first edge signal corresponding to the first series of pulses and a second edge signal corresponding to the second series of pulses, such that one of the first edge signal and the second edge signal comprises pulses aligned with a positive edge of the LO signal and the other of the first edge signal and the second edge signal comprises pulses aligned with a negative edge of the LO signal.

22. The modulation circuitry of claim 15, further comprising correction circuitry configured to input the phase modulated signal and generate, based at least on a correction control signal, a corrected phase modulated signal having an average duty cycle of 50%, further wherein the division control circuitry is configured to generate the correction control signal based at least on the output frequency.

23. The modulation circuitry of claim 15, wherein:

the counter comprises a series of latch elements, wherein alternating latch elements in the series are clocked by positive edges of the LO signal to generate pulses aligned with the positive edges of the LO signal with the remaining latch elements being clocked by negative edges of the LO signal to generate pulses aligned with the negative edges of the LO signal;

the counter circuitry is configured to initialize contents of the latch elements based on the desired N.5 division operation; and the selector circuitry combines pulses from a first latch element that is clocked by the positive edges of the LO signal and pulses from a second latch element that is clocked by the negative edges of the LO signal.

24. The modulation circuitry of claim 23, wherein the selector circuitry comprises OR circuitry configured to perform a logical OR operation on the pulses from the first latch element and the pulses from the second latch element.

25. The modulation circuitry of claim 23, wherein the counter circuitry is configured to initialize contents of the latch elements based on the desired duty cycle of the edge signal.

* * * * *

UNITED STATES PATENT AND TRADEMARK OFFICE
CERTIFICATE OF CORRECTION

| | |
|---|---|
| PATENT NO. | : 10,886,878 B2 |
| APPLICATION NO. | : 16/321308 |
| DATED | : January 5, 2021 |
| INVENTOR(S) | : Georgios Yorgos Palaskas |

It is certified that error appears in the above-identified patent and that said Letters Patent is hereby corrected as shown below:

On the Title Page

Column 1, The filing date of the PCT application in the PCT Filed item (22) shown as "Sep. 26, 2016" should read --Sep. 29, 2016--

Signed and Sealed this
Sixteenth Day of August, 2022

Katherine Kelly Vidal
*Director of the United States Patent and Trademark Office*